United States Patent
Kim et al.

(10) Patent No.: US 7,708,866 B2
(45) Date of Patent: May 4, 2010

(54) SPUTTERING APPARATUS

(75) Inventors: Sung Eun Kim, Woolsan-si (KR);
Cheon Soo Lee, Cheongju-si (KR);
Hwan Kyu Yoo, Gyeonggi-do (KR);
Byung Han Yun, Daegu-si (KR)

(73) Assignee: LG. Display Co., Ltd., Seoul (KR)

( * ) Notice: Subject to any disclaimer, the term of this patent is extended or adjusted under 35 U.S.C. 154(b) by 823 days.

(21) Appl. No.: 11/471,782

(22) Filed: Jun. 21, 2006

(65) Prior Publication Data
US 2007/0144890 A1   Jun. 28, 2007

(30) Foreign Application Priority Data
Jun. 28, 2005   (KR) .................. 10-2005-0056045

(51) Int. Cl.
*C23C 14/35* (2006.01)
(52) U.S. Cl. ............................ 204/192.12; 204/298.11; 204/298.07; 204/298.12; 204/298.26
(58) Field of Classification Search ............ 204/192.12, 204/298.07, 298.11, 298.12, 298.26
See application file for complete search history.

(56) References Cited

U.S. PATENT DOCUMENTS

| 4,425,218 | A | * | 1/1984 | Robinson | 204/298.07 |
| 5,049,251 | A | * | 9/1991 | Inoue | 204/192.12 |
| 5,223,111 | A | * | 6/1993 | Lueft | 204/298.07 |
| 5,322,605 | A | * | 6/1994 | Yamanishi | 204/298.07 |
| 5,662,784 | A | * | 9/1997 | Schuhmacher et al. | 204/298.07 |
| 5,922,133 | A | * | 7/1999 | Tepman et al. | 118/720 |
| 7,166,199 | B2 | * | 1/2007 | Hartig | 204/192.12 |

FOREIGN PATENT DOCUMENTS

JP          02-225663      *   9/1990

* cited by examiner

*Primary Examiner*—Rodney G McDonald
(74) *Attorney, Agent, or Firm*—Brinks Hofer Gilson & Lione

(57) ABSTRACT

A sputtering apparatus comprises a substrate unit that includes a substrate on which a target material is deposited in a chamber and a target unit on which a plurality of target sections formed of the target material are arranged. The sputtering apparatus further comprises a cathode plate that supplies electric power to surfaces of the plurality of target sections and a plurality of gas supply ports provided on regions between the plurality of target sections.

30 Claims, 4 Drawing Sheets

【Fig. 1】
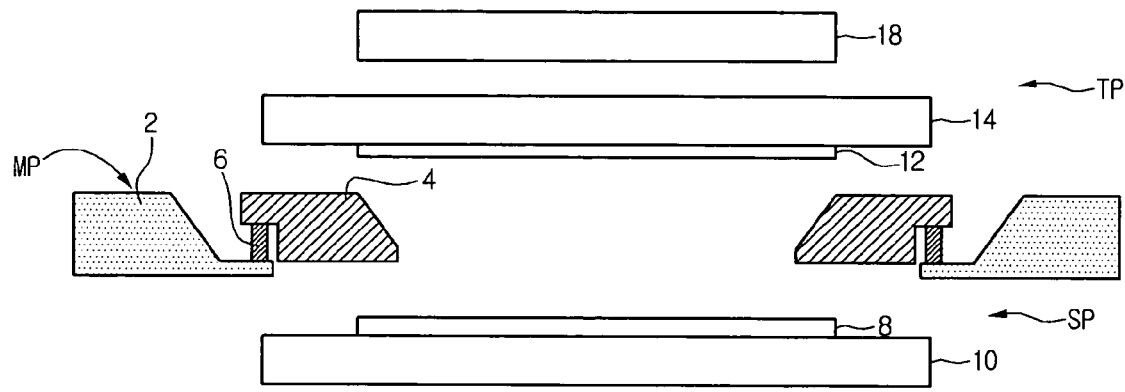
【Fig. 2】
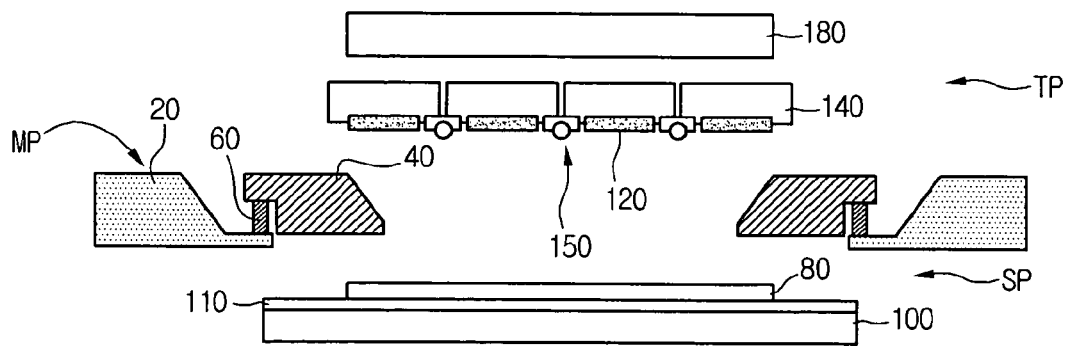

[Fig. 3A]
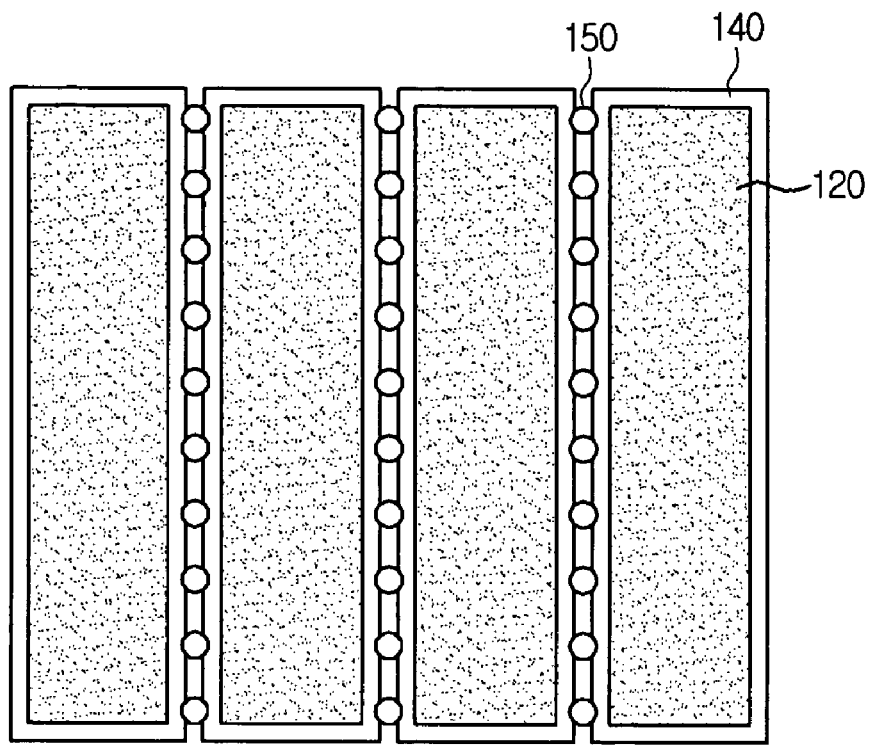
[Fig. 3B]
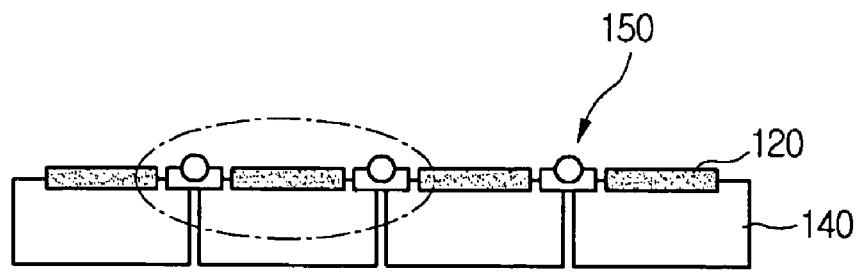

SPUTTERING APPARATUS

The present application claims the benefit of Korean Patent Application No. 2005-56045 filed in Korea on Jun. 28, 2005, which is hereby incorporated by reference.

FIELD

The present invention relates to a sputtering apparatus, and more particularly, to a sputtering apparatus having a plurality of gas ports provided to a cathode plate between target sections formed on the cathode plate.

BACKGROUND

Generally, a sputtering apparatus is used to deposit a target material on a substrate by accelerating ions using plasma and allowing the ions to collide with a target formed of the target material.

A sputtering process using a sputtering apparatus has an advantage of forming a thin film at a relatively low temperature of about 400° C. as compared with a chemical deposition process performed at a relatively high temperature.

The sputtering apparatus includes a target unit and a substrate unit that are provided in a chamber. The target unit and the substrate unit are respectively connected to a cathode and an anode. When a direct current power is applied to the cathode and the anode while generating a high frequency, electrons are emitted from a target of the target unit by an electric field and accelerated toward the anode.

At this point, the accelerated electrons collide with inert gas supplied into the chamber, thereby ionizing the gas. Cations of the inert gas collide with the target connected to the cathode by the electric field to realize the sputtering phenomenon by which the atoms are separated from the surface of the target.

Meanwhile, the electrons emitted from the target and accelerated toward the anode collide with neutral atoms to be excited and generate plasma. The plasma is maintained as far as the outer electric potential is maintained and the electrons are continuously generated. The separated target atoms are deposited on the substrate to form the thin film on the substrate.

FIG. 1 is a schematic sectional view of a related art sputtering apparatus.

Referring to FIG. 1, a related art sputtering apparatus includes a substrate unit SP, a target unit TP and a mask unit MP.

The target unit TP includes a rear plate 14 and a target 12. A magnet 18 may be disposed in rear of the rear plate 14. The magnet 18 forms a magnetic field to prevent electrons generated from plasma from straying off from a desired region. The target 12 that is a deposition material is fixed on the rear plate 14. A cathode (not shown) is provided between the target 12 and the rear plate 14.

The substrate unit SP includes a substrate 8 on which the deposition material will be deposited and a susceptor 10 supporting the substrate 8. An anode plate (not shown) is provided between the substrate 8 and the susceptor 10.

The mask unit MP includes a mask 2, a floating mask 4 and an insulation member 6 interposed between the mask 2 and the floating mask 4. The mask unit MP prevents the target material from being deposited on a non-deposition portion of the substrate 8. The mask 2 is formed in a rectangular frame shape and of a conductive material such as aluminum to generate plasma by maintaining an electric potential difference from the target 12 functioning as a cathode electrode.

The floating mask 4 is formed of a conductive material such as Al. The floating mask 4 is disposed inside the frame of the mask 2 and electrically insulated from the mask 2 by the insulation member 6.

In order to perform a sputtering process in a sputtering chamber, an inert gas must be supplied into the sputtering chamber. In the sputtering apparatus of FIG. 1, the inert gas is supplied through an inert gas supply port.

That is, the inert gas supply port is independently provided below the chamber to supply the inert gas into the chamber. The concentration of the inert gas is gradually lowered toward a central portion of the substrate as the area of the substrate increase.

Therefore, the concentration of the plasma generated at a region close to the inert gas supply port may be different from that of the plasma generated at a region far from the inert gas supply port. In some case, there may be a region where the plasma is not generated.

In the regions where the concentration of the plasma is lower or the plasma is not generated, the cations of the inert gas collide by an electric field with the target connected to a cathode. However, the energy is too low to separate the target atoms from the surface of the target. That is, the sputtering is not normally realized.

Therefore, the substrate on which the target material will be deposited is large, a region where the plasma is not generated is created at the chamber region between the target and the substrate, thereby varying the property of a film deposited on the substrate.

Furthermore, as the substrate is large, a composition of the material deposited on the substrate is not uniform.

SUMMARY

Accordingly, the present invention is directed to a sputtering apparatus that substantially obviates one or more problems due to limitations and disadvantages of the related art.

A sputtering apparatus comprises a substrate unit that includes a substrate on which a target material is deposited in a chamber and a target unit on which a plurality of target sections formed of the target material are arranged. The sputtering apparatus further comprises a cathode plate that supplies electric power to surfaces of the plurality of target sections and a plurality of gas supply ports provided on regions between the plurality of target sections.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a schematic sectional view of a related art sputtering apparatus.

FIG. 2 is a sectional view of a sputtering apparatus according to an embodiment of the present invention;

FIGS. 3A and 3B are top and sectional views of the sputtering apparatus of FIG. 2, respectively;

DETAILED DESCRIPTION

Figure 4:
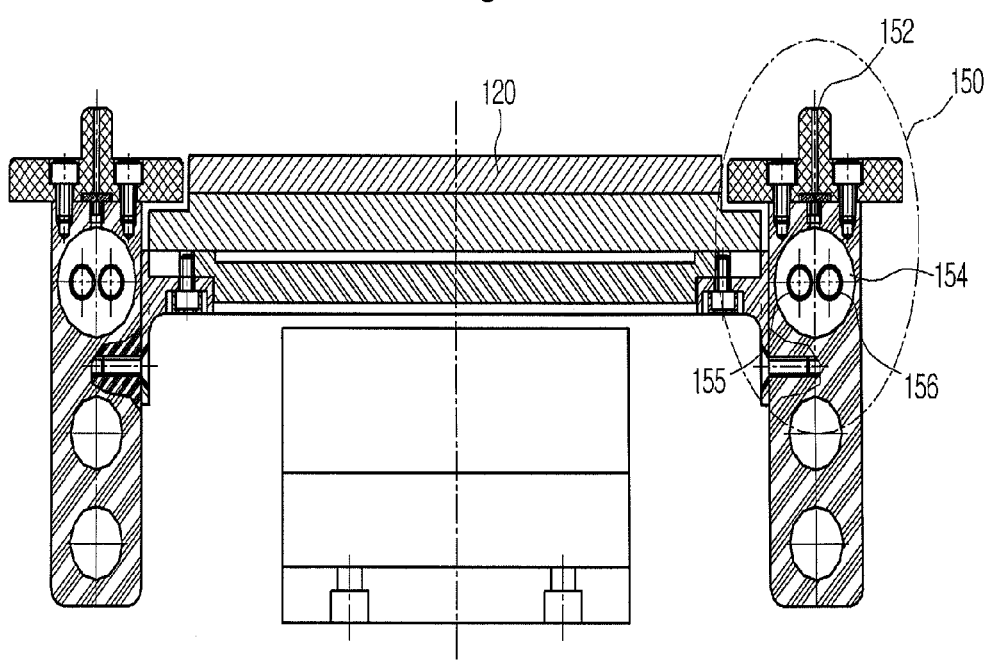
FIG. 4 is an enlarged sectional view of a specific portion of FIG. 3B.

Reference will now be made in detail to the preferred embodiments of the present invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

According to a feature of the present invention, a target is divided into a plurality of target sections and the target sections are attached on a cathode plate. On regions between the target sections, a plurality of gas supply ports are provided.

Inert gas is supplied into a chamber through the plurality of gas supply ports to uniformly distribute the inert gas in a space between the cathode and anode plates that are disposed in the chamber, thereby improving the uniformity of the property of a film that will be deposited on a substrate.

FIG. 2 is a sectional view of a sputtering apparatus according to an embodiment of the present invention and FIGS. 3A and 3B are respectively top and sectional views of the sputtering apparatus of FIG. 2.

Referring first to FIG. 2, a sputtering apparatus of this embodiment includes a substrate unit SP, a target unit TP and a mask unit MP, which are disposed in a chamber (not shown).

The substrate unit SP includes a substrate 80 on which a deposition material will be deposited through a sputtering process, a susceptor 100 supporting the substrate 80, and an anode plate 110 disposed between the substrate 80 and the susceptor 100.

The target unit TP includes a cathode plate 140 and a target 120. A magnet 180 may be disposed in rear of the rear plate 140. The magnet 180 forms a magnetic field to prevent electrons generated from plasma from straying off from a desired region. The target 120 that is a deposition material is fixed on the cathode plate 140.

The mask unit MP includes a mask 20, a floating mask 40 and an insulation member 60 interposed between the mask 20 and the floating mask 40. The mask unit MP prevents the target material from being deposited on a non-deposition portion of the substrate 80. The mask 20 is formed in a rectangular frame shape and of a conductive material such as aluminum to generate plasma by maintaining an electric potential difference from the target 120 functioning as a cathode. The floating mask 40 is formed of a conductive material such as Al. The floating mask 40 is disposed inside the frame of the mask 20 and electrically insulated from the mask 20 by the insulation member 60.

In this embodiment, as shown in FIGS. 3A and 3B, the cathode plate 140 functions to fix the target 120 that is the deposition material that will be deposited on the substrate 80 by sputtering. As the substrate 80 is large, the target 120 is divided into a plurality of target sections spaced away from each other and arranged on the cathode plate 140.

According to a feature of the present invention, a plurality of gas supply ports 150 are provided on the cathode plate 140 at regions between the plurality of target sections of the target 120 arranged on the cathode plate 140.

Inert gas is supplied into the chamber through the gas supply ports 150 provided on the cathode plate 140. Therefore, the inert gas is uniformly distributed in a space between the cathode plate 140 and the anode plate 110 formed under the substrate 80 on which the target material will be deposited, thereby uniformly maintaining a property of a film deposited on the substrate 80.

As described above, in order to perform a sputtering process in the sputtering chamber, the inert gas is supplied to the sputtering chamber through the plurality of gas supply ports.

In the related art, since the inert gas is supplied into the chamber through an independent gas supply port, a region where the plasma is not generated is created at the chamber region between the target and the substrate as the substrate on which the target material will be deposited is large, thereby varying the property of the film deposited on the substrate. However, in this embodiment, since the inert gas is supplied through the plurality of gas supply ports provided to the cathode plate, the problem of the related art can be solved.

The plurality of gas supply ports 150 provided to the cathode plate 140 will now be described with reference to FIGS. 4 and 5.

FIG. 4 is an enlarged sectional view of a specific portion of FIG. 3B.

Referring to FIG. 4, there is shown in detail the gas supply ports provided to the cathode plate. The gas supply ports 150 are provided at left and right sides of each target section of the target 120.

The gas supply port 150 includes a gas nozzle 152 and a gas supply portion 154 supplying the inert gas to the gas nozzle 152. The gas supply portion 154 includes a pair of gas supply passages 155 and 156.

The pair of gas supply passages 155 and 156 function to discharge the inert gas upward and downward, respectively. The pair of gas supply passages 155 and 156 alternately discharge the inert gas at a predetermined time interval.

That is, since the gas supply port performs two-phased injection of the inert gas, the pressure difference of the inert gas injected can be reduced, thereby more uniformly injecting the inert gas into the chamber.

Figure 5:
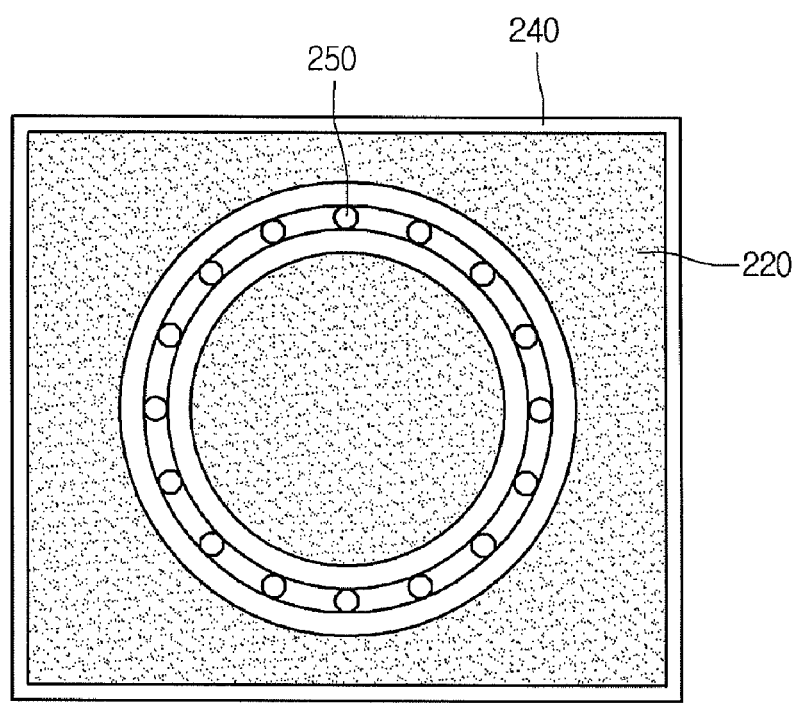
FIG. 5 is a top view of a cathode plate and a target unit of a sputtering apparatus according to another embodiment of the present invention.

FIG. 5 is a top view of a cathode plate and a target unit of a sputtering apparatus according to another embodiment of the present invention.

Referring to FIG. 5, a plurality of gas supply ports 250 are arranged between target sections of a target 220. The gas supply ports 250 are arranged along a closed-line at predetermined intervals and oriented toward a substrate. The closed-line may be a perfect circle. The target sections of the target 220 may be divided by the closed-line such that they can be formed in a closed surface.

The cathode plate 240 may be divided into a number of cathode sections. The number of cathode sections of the cathode plate 240 may be identical to or different from that of the target sections of the target 220.

According to the present invention, The sputtering apparatus can form a film on a substrate such that the film has a uniform film property by supplying inert gas into a chamber through a plurality of gas supply ports provided on regions between a plurality of target sections of a target and thus uniformly distribution the inert gas in a space between a cathode plate and an anode plate in the chamber.

In addition, since the gas supply port performs two-phased injection of the inert gas, the inert can be more uniformly injected into the chamber.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A sputtering apparatus comprising:
a substrate unit that includes a substrate on which a target material is deposited in a chamber;
a target unit on which a plurality of target sections formed of the target material are arranged;
a cathode plate that supplies electric power to surfaces of the plurality of target sections; and
a plurality of gas supply ports provided on regions between the plurality of target sections,
wherein each of the plurality of gas supply ports includes a gas nozzle that injects inert gas into the chamber and a gas supply portion that supplies the inert gas to the gas nozzle,
wherein the gas supply portion includes a pair of gas supply passages and the pair of gas supply passages alternately discharge the inert gas upward and downward in the gas supply portion.

2. The sputtering apparatus according to claim 1, wherein the plurality of gas supply ports supply inert gas into the chamber.

3. The sputtering apparatus according to claim 1, wherein the plurality of target sections are arranged on the cathode plate at predetermined intervals.

4. The sputtering apparatus according to claim 1, further comprising a mask unit to deposit the target material on a desired portion of the substrate.

5. The sputtering apparatus according to claim 4, wherein the mask unit comprises a mask, a floating mask and an insulation member interposed therebetween.

6. The sputtering apparatus according to claim 1, wherein the cathode plate is divided into a plurality of cathode sections.

7. The sputtering apparatus according to claim 6, wherein the number of the plurality of cathode sections is identical to that of the plurality of target sections.

8. The sputtering apparatus according to claim 6, wherein the number of the plurality of cathode sections is different from that of the plurality of target sections.

9. The sputtering apparatus according to claim 1, wherein the substrate unit further includes an anode plate disposed under the substrate.

10. The sputtering apparatus according to claim 1, wherein the plurality of gas supply ports are arranged along an opened line or a closed line.

11. The sputtering apparatus according to claim 1, wherein the plurality of gas supply ports are arranged along a closed line and the closed line is a perfect circle.

12. The sputtering apparatus according to claim 1, wherein the substrate unit further comprises a susceptor that supports the substrate.

13. The sputtering apparatus according to claim 1, wherein the target unit further comprises a magnet disposed in rear of the cathode plate.

14. The sputtering apparatus according to claim 1, wherein the plurality of gas supply ports are provided on the cathode plate.

15. The sputtering apparatus according to claim 1, wherein the plurality of gas supply ports are provided at one or more sides of each of the plurality of target sections.

16. A method of depositing a material on a substrate comprising:
providing a substrate on which a target material is deposited in a chamber;
arranging a plurality of target sections formed of the target material on a cathode plate;
supplying electric power to surfaces of the plurality of target sections; and
supplying a gas through a plurality of gas supply ports provided on regions between the plurality of target sections,
wherein each of the plurality of gas supply ports includes a gas nozzle that injects inert gas into the chamber and a gas supply portion that supplies the inert gas to the gas nozzle,
wherein the gas supply portion includes a pair of gas supply passages and the pair of gas supply passages alternately discharge the inert gas upward and downward in the gas supply portion.

17. The method of depositing a material on a substrate according to claim 16, wherein the plurality of gas supply ports supply inert gas into the chamber.

18. The method of depositing a material on a substrate according to claim 16, wherein the plurality of target sections are arranged on the cathode plate at predetermined intervals.

19. The method of depositing a material on a substrate according to claim 16, further comprising depositing the target material on a desired portion of the substrate using a mask unit.

20. The method of depositing a material on a substrate according to claim 19, wherein the mask unit comprises a mask, a floating mask and an insulation member interposed therebetween.

21. The method of depositing a material on a substrate according to claim 16, wherein the cathode plate is divided into a plurality of cathode sections.

22. The method of depositing a material on a substrate according to claim 21, wherein the number of the plurality of cathode sections is identical to that of the plurality of target sections.

23. The method of depositing a material on a substrate according to claim 21, wherein the number of the plurality of cathode sections is different from that of the plurality of target sections.

24. The method of depositing a material on a substrate according to claim 16, wherein an anode plate is disposed under the substrate.

25. The method of depositing a material on a substrate according to claim 16, wherein the plurality of gas supply ports are arranged along an opened line or a closed line.

26. The method of depositing a material on a substrate according to claim 16, wherein the plurality of gas supply ports are arranged along a closed line and the closed line is a perfect circle.

27. The method of depositing a material on a substrate according to claim 16, wherein a susceptor supports the substrate.

28. The method of depositing a material on a substrate according to claim 16, wherein a magnet is disposed in rear of the cathode plate.

29. The method of depositing a material on a substrate according to claim 16, wherein the plurality of gas supply ports are provided on the cathode plate.

30. The method of depositing a material on a substrate according to claim 16, wherein the plurality of gas supply ports are provided at one or more sides of each of the plurality of target sections.

* * * * *

UNITED STATES PATENT AND TRADEMARK OFFICE
CERTIFICATE OF CORRECTION

| | |
|---|---|
| PATENT NO. | : 7,708,866 B2 |
| APPLICATION NO. | : 11/471782 |
| DATED | : May 4, 2010 |
| INVENTOR(S) | : Sung Eun Kim et al. |

It is certified that error appears in the above-identified patent and that said Letters Patent is hereby corrected as shown below:

On the Title Page

Item (73) ADD two other assignees "LG Electronics, Inc., Seoul (KR) and Avaco Co., Ltd., Daegu-si (KR)"

Signed and Sealed this
Twenty-second Day of January, 2013

David J. Kappos
*Director of the United States Patent and Trademark Office*